(12) United States Patent
Stoerk

(10) Patent No.: US 10,826,515 B2
(45) Date of Patent: Nov. 3, 2020

(54) GLITCH REDUCTION IN SEGMENTED RESISTOR LADDER DAC

(71) Applicant: Texas Instruments Incorporated, Dallas, TX (US)

(72) Inventor: Carsten Ingo Stoerk, Freising (DE)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 16/426,859

(22) Filed: May 30, 2019

(65) Prior Publication Data

US 2020/0127674 A1 Apr. 23, 2020

Related U.S. Application Data

(60) Provisional application No. 62/746,889, filed on Oct. 17, 2018.

(51) Int. Cl.
*H03M 1/78* (2006.01)
*H03M 1/08* (2006.01)
*H03K 19/21* (2006.01)

(52) U.S. Cl.
CPC .......... *H03M 1/0863* (2013.01); *H03K 19/21* (2013.01)

(58) Field of Classification Search
CPC .......................... H03M 1/0863; H03M 1/0872
USPC .......................................... 341/118, 144, 154
See application file for complete search history.

(56) References Cited

U.S. PATENT DOCUMENTS

| | | | | |
|---|---|---|---|---|
| 3,482,255 A | * | 12/1969 | Baker, Jr. | ................ G06F 3/153 347/231 |
| 4,823,128 A | * | 4/1989 | Barak | ................ H03M 1/0863 341/118 |
| 2015/0325200 A1 | * | 11/2015 | Rho | ........................ G09G 3/20 345/212 |

* cited by examiner

*Primary Examiner* — Peguy Jean Pierre
(74) *Attorney, Agent, or Firm* — Lawrence J. Bassuk; Charles A. Brill; Frank D. Cimino

(57) ABSTRACT

An electronic device includes a digital-to-analog converter coupled to receive a reference voltage and a binary-encoded digital input signal. The electronic device provides an analog output signal that represents the value of the binary-encoded digital input signal and a transmission gate is coupled to pass the analog output signal. A blank pulse generator is coupled to receive selected bits of the binary-encoded digital input signal and to pulse the transmission gate off when the selected bits change value, thus providing a blanked analog output signal.

15 Claims, 7 Drawing Sheets

GLITCH REDUCTION IN SEGMENTED RESISTOR LADDER DAC

PRIORITY UNDER 35 U.S.C. § 119(e) & 37 C.F.R. § 1.78

This non-provisional application claims priority based upon the following prior United States provisional patent application(s): (i) "Glitch Reduction in Segmented Resistor Ladder DACs," Application No. 62/746,889, filed Oct. 17, 2018 in the name(s) of Carsten Ingo Stoerk, which is hereby incorporated by reference in its entirety.

BACKGROUND

Implementing a reference voltage digital-to-analog converter (DAC) as a thermometer-encoded resistor ladder DAC has the advantages of speed, high precision, simplicity and inherent monotonicity. However, when high resolution is desired, e.g., greater than six bits, the DAC cannot be implemented in an area efficient way with a pure thermometer-encoded resistor ladder. Instead a segmented DAC, e.g., combining a binary weighted DAC and a thermometer DAC, is used for area optimization. However, the segmented DAC approach suffers from high voltage glitches during transitions between the binary weighted segment and the thermometer segment.

SUMMARY

Disclosed embodiments provide a blanking circuit that controls transmission of the segmented DAC's analog output signal via a transmission gate. Selected bits of a binary-encoded digital input signal for the DAC are provided to the blanking circuit, which then turns off the transmission gate to blank the voltage glitches during each transition. The selected bits can include the least significant bit (LSB), all of the LSBs, or the most significant bits (MSBs) for the binary-encoded digital input signal, depending on whether the need is to block glitches only during specific transitions, e.g., transitions between the binary-encoded segment and the thermometer-encoded segment, or to block every transition.

In one aspect, an embodiment of an electronic device is disclosed. The electronic device includes a DAC coupled to receive a reference voltage and a binary-encoded digital input signal and further coupled to provide an analog output signal that represents the value of the binary-encoded digital input signal; a transmission gate coupled to receive the analog output signal and to provide a blanked analog output signal; and a blank pulse generator coupled to receive selected bits of the binary-encoded digital input signal and to pulse the transmission gate off when the selected bits change value.

In another aspect, an embodiment of a method of operating a segmented resistor ladder DAC is disclosed. The method includes providing an electronic device comprising a segmented resistor ladder DAC and a blanking circuit, the segmented resistor ladder DAC comprising a plurality or group of thermometer-DAC resistors coupled to be controlled by M most significant bits (MSBs) of a binary-encoded digital input signal and a first plurality or group of N binary-DAC resistors and a second plurality or group of N binary-DAC resistors coupled to be controlled by N least significant bits (LSBs) of the binary-encoded digital input signal, the blanking circuit coupled to receive an analog output signal from the segmented resistor ladder DAC, to block transmission of the analog output signal when a selected portion of the binary-encoded digital input signal changes, and to provide a blanked analog output signal; coupling an input of the electronic device to receive the binary-encoded digital input signal, the binary-encoded digital input signal comprising M plus N bits; and coupling an output of the electronic device to provide the blanked analog output signal.

BRIEF DESCRIPTION OF THE DRAWINGS

Embodiments of the present disclosure are illustrated by way of example, and not by way of limitation, in the figures of the accompanying drawings in which like references indicate similar elements. It should be noted that different references to "an" or "one" embodiment in this disclosure are not necessarily to the same embodiment, and such references may mean at least one. Further, when a particular feature, structure, or characteristic is described in connection with an embodiment, it is submitted that it is within the knowledge of one skilled in the art to effect such feature, structure, or characteristic in connection with other embodiments whether or not explicitly described. As used herein, the term "couple" or "couples" is intended to mean either an indirect or direct electrical connection unless qualified as in "communicably coupled" which may include wireless connections. Thus, if a first device couples to a second device, that connection may be through a direct electrical connection, or through an indirect electrical connection via other devices and connections.

The accompanying drawings are incorporated into and form a part of the specification to illustrate one or more exemplary embodiments of the present disclosure. Various advantages and features of the disclosure will be understood from the following Detailed Description taken in connection with the appended claims and with reference to the attached drawing figures in which:

DETAILED DESCRIPTION OF THE DRAWINGS

Specific embodiments of the invention will now be described in detail with reference to the accompanying figures. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

Figure 6:
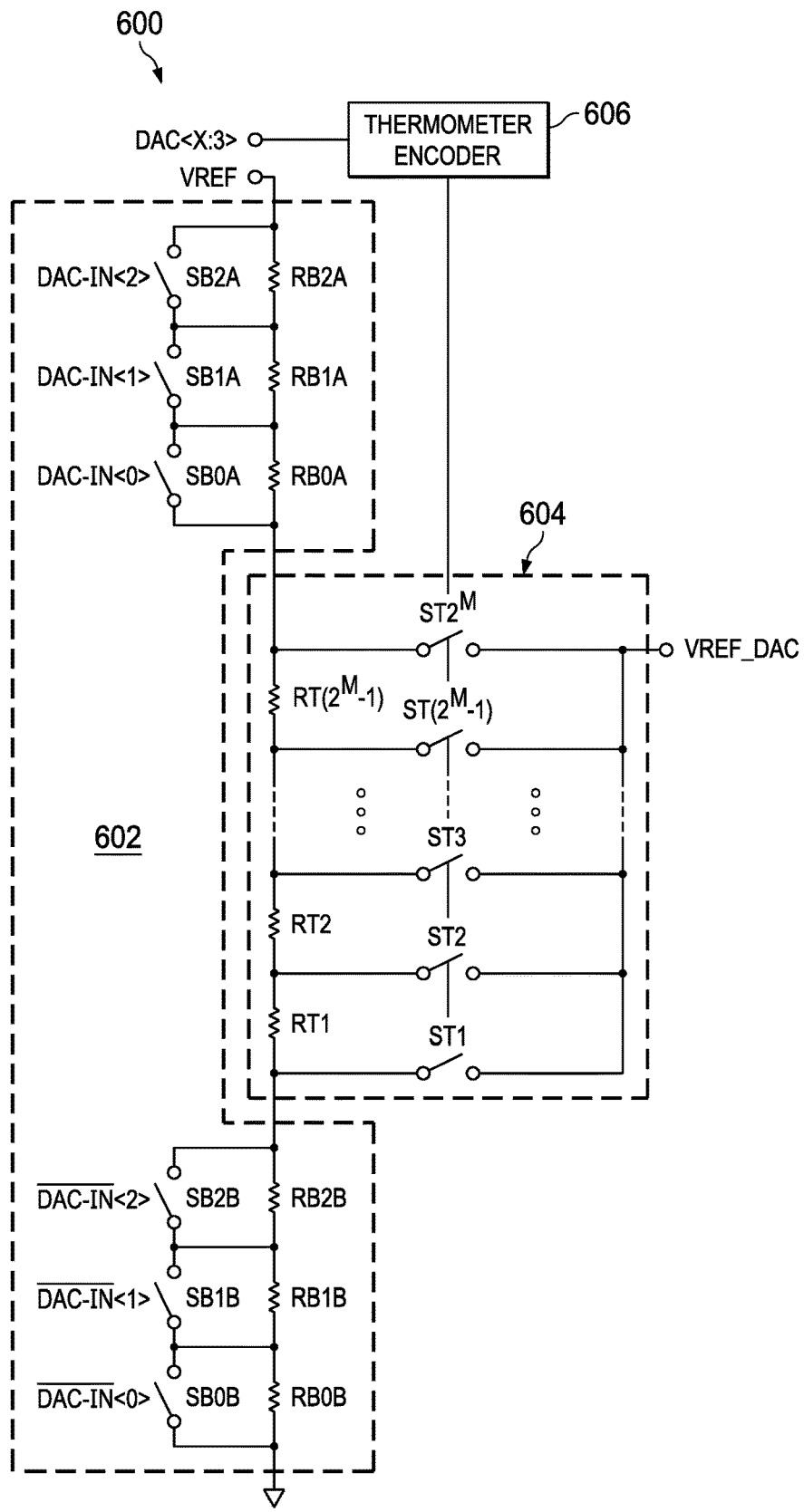
FIG. 6 depicts an embodiment of a segmented DAC that can be utilized with the disclosed glitch-reducing circuit.

FIG. 6 depicts a standard implementation of a segmented resistor ladder DAC 600. Segmented resistor ladder DAC 600 receives a reference voltage VREF and a binary-encoded digital input signal DAC-IN<X:0> and provides an analog output signal VREF_DAC that represents the value of the binary-encoded digital input signal DAC-IN as a voltage level. Segmented resistor ladder DAC 600 includes a binary-encoded DAC segment 602 that receives the least significant bits of the binary-encoded digital input signal DAC-IN, e.g., DAC-IN<2:0>, a thermometer-encoded DAC segment 604 that receives the most significant bits of the binary-encoded digital input signal DAC-IN, e.g., DAC-IN<X:3>, and a thermometer encoder 606 that decodes the binary-encoded digital input signal DAC-IN<X:3> to operate thermometer-encoded DAC segment 604.

For simplicity, segmented resistor ladder DAC 600 will be discussed in terms of a binary-encoded digital input signal DAC-IN that has six bits although it will be understood that the signal can have seven, eight, or any number of bits. For the sake of discussion, there are M most significant bits and N least significant bits, where in the embodiment discussed, M is three and N is three. The three least significant bits, e.g., DAC<0>, DAC<1>, DAC<2>, are provided to the binary-encoded DAC segment 602 and the three most significant bits DAC<5:3> are provided to the thermometer encoder 606 to be used to control thermometer-encoded DAC segment 604.

The binary-encoded DAC segment 602 contains two groups of resistors. A first plurality or group of binary-DAC resistors includes first binary-DAC resistor RB0A, second binary-DAC resistor RB1A and third binary-DAC resistor RB2A, which are coupled in series between a connection to the reference voltage VREF and the thermometer-encoded DAC segment 604. A second plurality or group of binary-DAC resistors includes fourth binary-DAC resistor RB0B, fifth binary-DAC resistor RB1B and sixth binary-DAC resistor RB2B, which are coupled in series between the thermometer-encoded DAC segment 604 and the lower rail, which can be a local ground connection. In the embodiment shown, each of first binary-DAC resistor RB0A and fourth binary-DAC resistor RB0B has a value of 1R. Similarly, each of second binary-DAC resistor RB1A and fifth binary-DAC resistor RB1B has a value of 2R and each of third binary-DAC resistor RB2A and sixth binary-DAC resistor RB2B has a value of 4R.

Each of the first plurality or group of binary-DAC resistors RB0A, RB1A, RB2A is paired with a corresponding switch from a first plurality or group of binary-DAC switches SB0A, SB1A, SB2A. Likewise, each of the second plurality or group of binary-DAC resistors RB0B, RB1B, RB2B is paired with a corresponding switch from a second plurality or group of binary-DAC switches SB0B, SB1B, SB2B. When any of binary-DAC switches SB0A, SB1A, SB2A, SB0B, SB1B, SB2B is closed, a corresponding binary-DAC resistor RB0A, RB1A, RB2A, RB0B, RB1B, RB2B is bypassed and the value associated with that resistor is not used. When any of binary-DAC switches SB0A, SB1A, SB2A, SB0B, SB1B, SB2B is open, the reference voltage flows through a corresponding binary-DAC resistor RB0A, RB1A, RB2A, RB0B, RB1B, RB2B and the value associated with that resistor is used to determine the final voltage on analog output signal VREF_DAC.

Thermometer-encoded DAC segment 604 includes $2^M-1$ thermometer-DAC resistors RT1 through RT$2^M$-1 and $2^M$ thermometer-DAC switches ST1-ST$2^M$, because M bits of a binary-encoded signal can encode $2^M$ analog output levels. In the example of a six-digit digital input value where the three LSBs are decoded by the binary-encoded DAC segment 602, there will be seven thermometer-DAC resistors, each having a resistance of 8R and eight respective thermometer-DAC switches. The thermometer-DAC resistors can be coupled in series between reference voltage VREF and the lower rail, with the thermometer-DAC switches providing $2^M$ tap points from which to draw the desired voltage. The switching of thermometer-encoded DAC segment 604 is managed by thermometer encoder 606.

Figure 7:
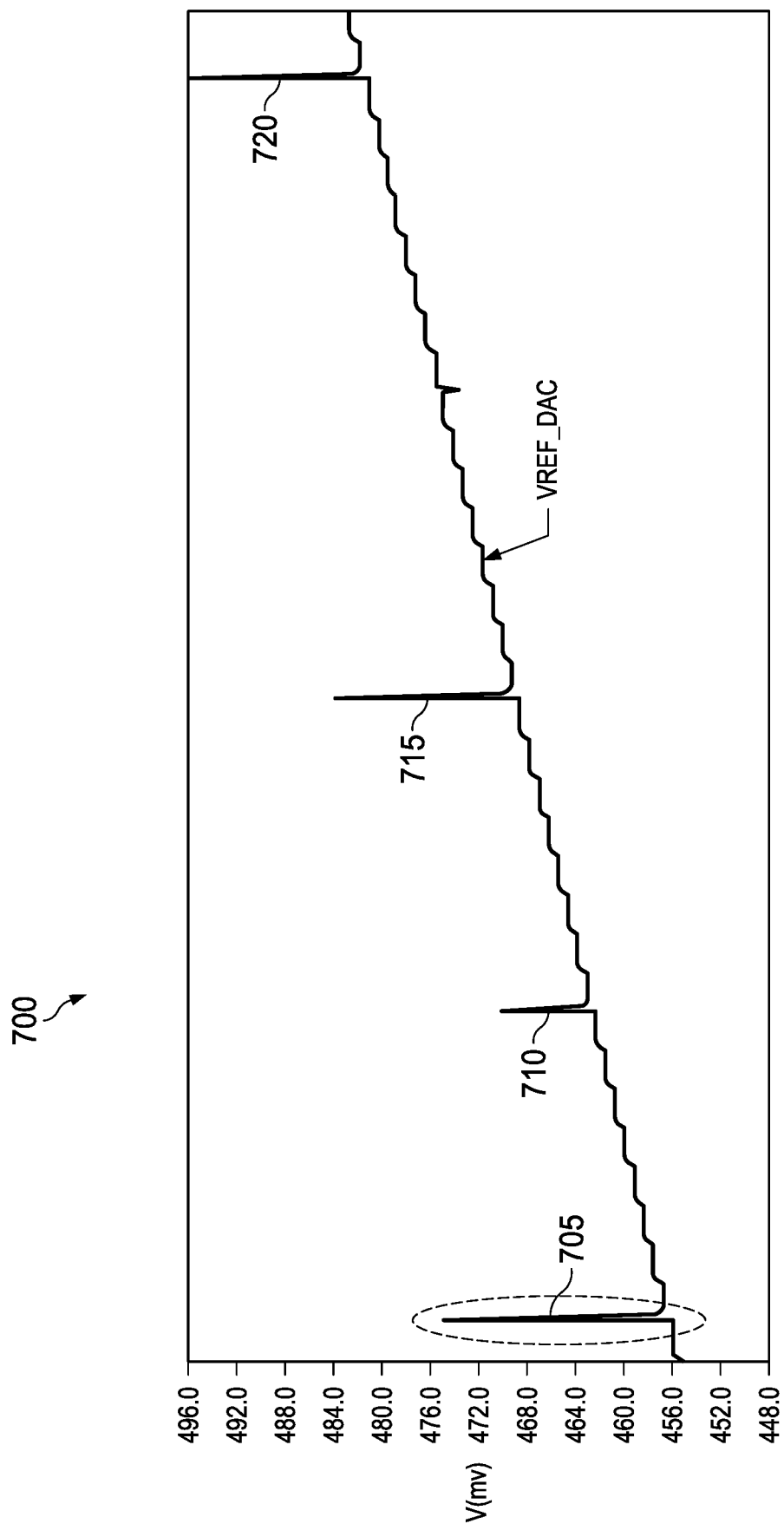
FIG. 7 depicts the output analog signal of a segmented DAC that lacks a glitch-reducing circuit.

FIG. 7 depicts a graph 700 of analog output signal VREF_DAC produced by segmented resistor ladder DAC 600 as the example binary-encoded digital input signal DAC-IN is stepped through possible values. Each incremental increase in binary-encoded digital input signal DAC-IN causes a desired stair-step increment in the value of analog output signal VREF_DAC. However, at each eighth step the change to a new value can cause a large voltage spike, such as voltage spike 705, 710, 715, 720, that is many times greater than one LSB of the analog output signal VREF_DAC. These glitches occur when the binary-DAC switches SB0A, SB1A, SB2A, SB0B, SB1B, SB2B are all switching from being open to being closed. These large glitches need to be removed, as their continued presence can cause the signal to be misread.

Figure 1:
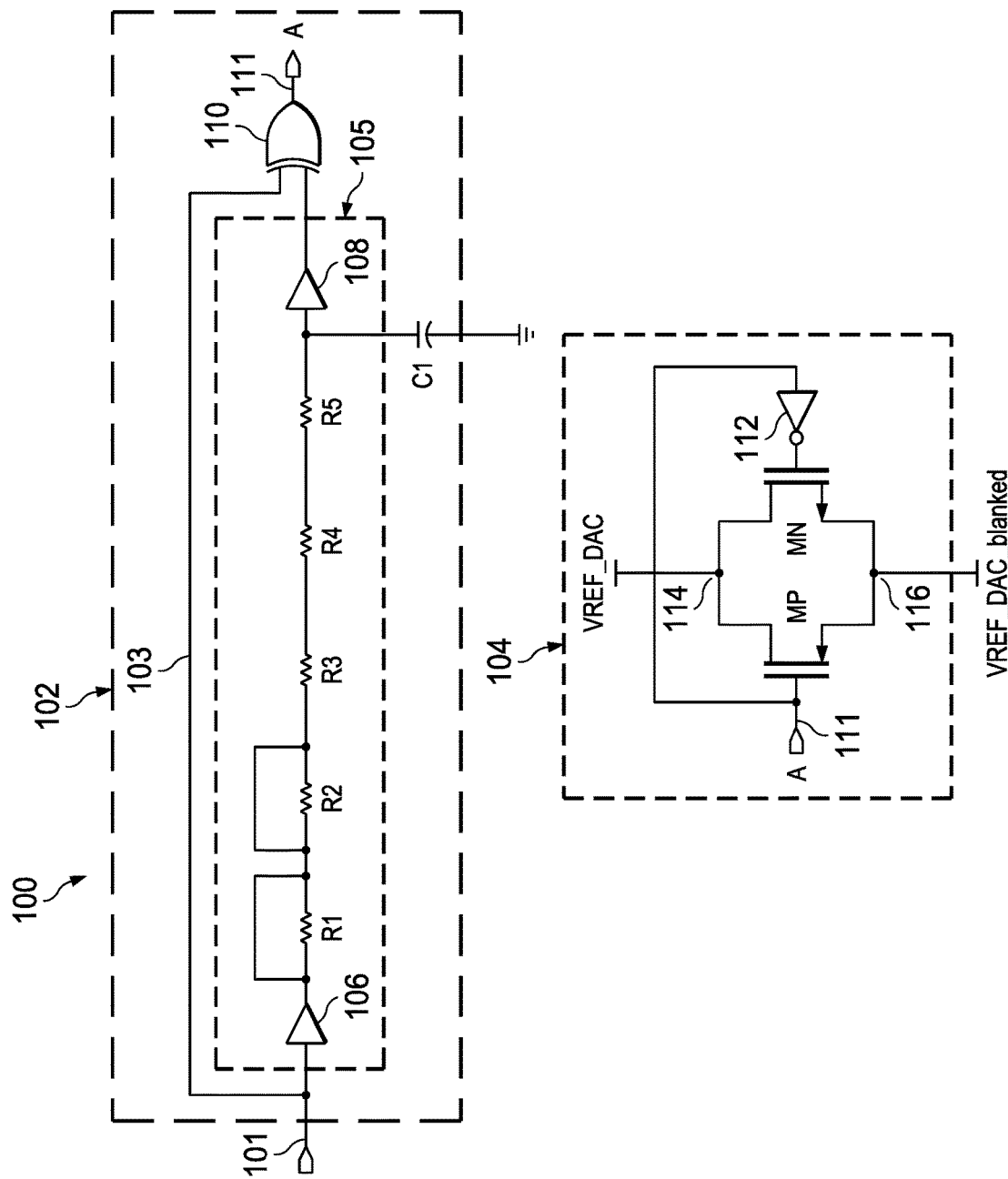
FIG. 1 depicts an example of a blanking circuit for use with a segmented DAC according to an embodiment of the disclosure.

FIG. 1 depicts a blanking circuit 100 that includes a blank pulse generator 102 and a transmission gate 104. Blanking circuit 100 is able to block the voltage spikes from being transmitted as part of the analog output signal VREF_DAC. Blank pulse generator 102 contains a first buffer 106, a plurality or group of blanking resistors, which in the disclosed embodiment includes blanking resistors R1-R5, capacitor C1, second buffer 108 and exclusive OR (XOR) gate 110. Blank pulse generator 102 receives a blanking signal 101 that includes selected bits of the binary-encoded digital input signal DAC-IN and passes blanking signal 101 to XOR gate 110 along two paths. A first path 103 carries blanking signal 101 directly to a first input of XOR gate 110. A second path 105 is formed by first buffer 106, the plurality or group of blanking resistors R1-R5 and second buffer 108, which are coupled in series between the blanking signal 101 and a second input of XOR gate 110.

Capacitor C1 is coupled between the plurality or group of blanking resistors R1-R5 and second buffer 108; capacitor C1 and the plurality or group of blanking resistors R1-R5 provide an RC delay for blanking signal 101 that can be set by the value of capacitor C1 and the number of blanking resistors R1-R5. In the embodiment shown, blank pulse generator 102 was designed to utilize three blanking resistors R3, R4, R5. It will be understood that blanking resistors R1, R2, which are shown having permanent bypasses, have been provided to decrease the delay in case last minute changes were necessary to the RC delay prior to production and that the number of resistors used is a factor of the technology utilized and the specific embodiment.

During operation of blank pulse generator 102, whenever the value of blanking signal 101 changes, the new value of blanking signal 101 travels along first path 103 very quickly, while the new value is delayed along second path 105. This causes a momentary difference between the first and second inputs of XOR gate 110 and causes XOR gate 110, which usually outputs a low value on blanking control signal 111, to output a high pulse, with the length of the pulse determined by the RC delay on second path 105.

Transmission gate 104 includes a P-type metal oxide silicon (PMOS) transistor MP and an N-type metal oxide silicon (NMOS) transistor MN and an inverting buffer 112. PMOS transistor MP and NMOS transistor MN are coupled to each other at both of their respective source/drain terminals. The transmission gate 104 is coupled to receive analog output signal VREF_DAC at a first point 114, which is coupled to a first source/drain terminal of each of PMOS transistor MP and NMOS transistor MN, and to provide blanked analog output signal VREF_DAC_blanked at a second point 116 that is coupled to a second source/drain terminal of each of PMOS transistor MP and NMOS transistor MN. In order to block portions of analog output signal VREF_DAC, PMOS transistor MP is controlled by blanking control signal 111 and NMOS transistor MN is controlled by the inverse of blanking control signal 111. When the value of blanking signal 101 is steady, blanking control signal 111 is low, which turns on PMOS transistor MP, while the inverse of blanking control signal 111 also turns on NMOS transistor MN, such that analog output signal VREF_DAC is passed directly through transmission gate 104 to form blanked analog output signal VREF_DAC_blanked. However, when the value of blanking signal 101 changes, XOR gate sends a high pulse on blanking control signal 111, turning off both PMOS transistor MP and NMOS transistor MN during the high pulse and causing the value of analog output signal VREF_DAC to be momentarily blocked.

For a segmented DAC containing both a binary-encoded DAC segment and a thermometer-encoded DAC segment, as in segmented resistor-ladder DAC 600, the selected bits of the binary-encoded digital input signal DAC-IN that form blanking signal 101 may be any of the N LSBs, e.g. DAC-IN<2:0>, the single least significant bit DAC-IN<0>, or the M MSBs, e.g. DAC-IN<5:3>. When blank pulse generator 102 receives the M MSBs of the binary-encoded digital input signal DAC-IN as blanking control signal 111, then blanking circuit 100 will only blank out the larger voltage glitches that occur during changes in the values of the MSBs, e.g., the glitches shown every eighth change in value in FIG. 7. When blank pulse generator 102 receives the N LSBs of the binary-encoded digital input signal DAC-IN or the LSB DAC-IN<0>, then blanking circuit 100 will blank out every voltage glitch that occurs during changes in the values of the LSBs, i.e., during every change of value shown in FIG. 7.

Figure 2:
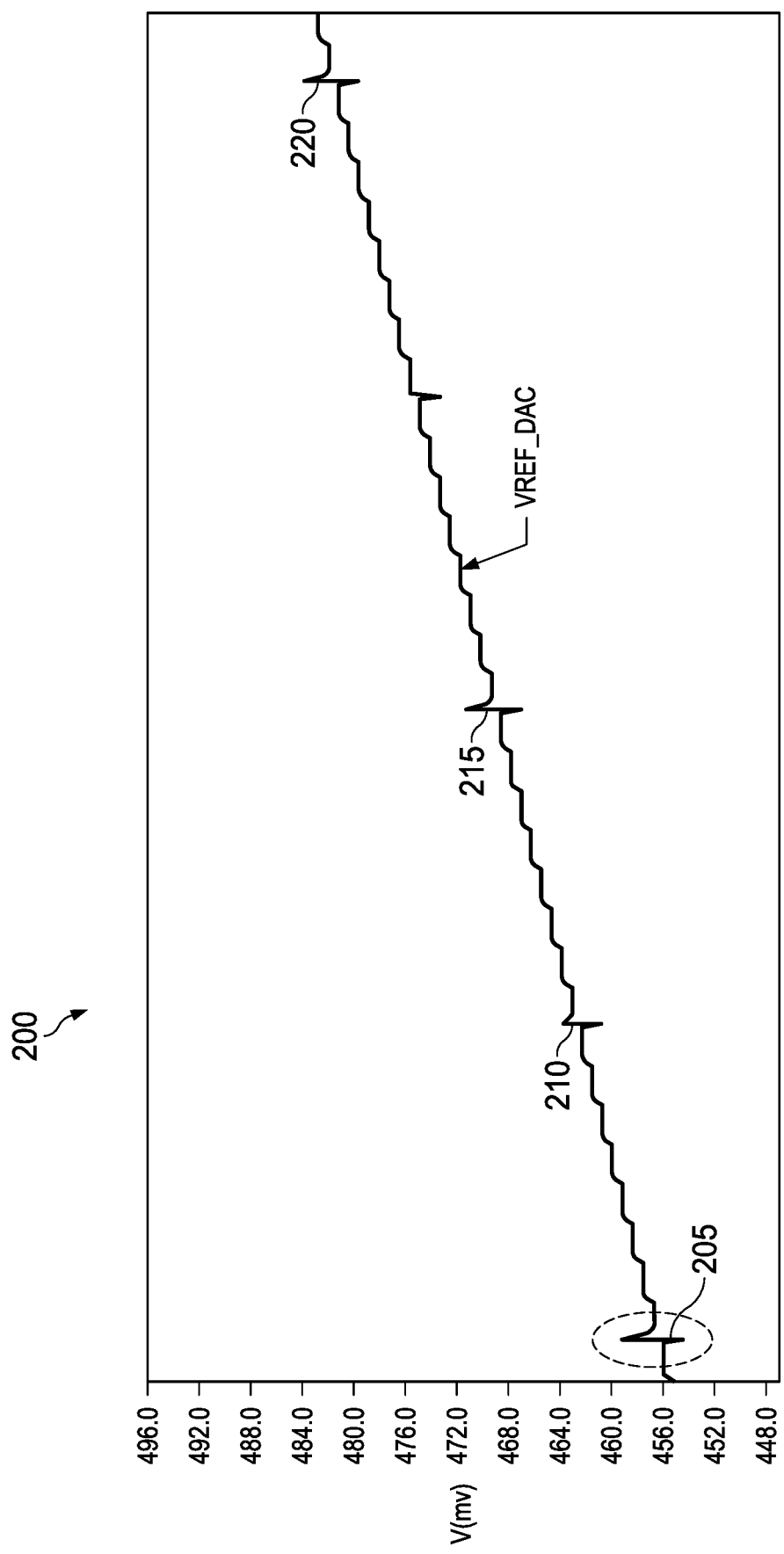
FIG. 2 depicts the output analog signal of a segmented DAC having a glitch-reducing circuit according to an embodiment of the disclosure.

FIG. 2 depicts a graph 200 of output analog signal VREF_DAC by a version of segmented resistor ladder DAC 600 that includes the blanking circuit 100 as the example binary-encoded digital input signal DAC-IN<5:0> is stepped through possible values. As can be seen in this figure, the previous large voltage spikes seen at every eighth increment in value have each been replaced by a small drop in voltage followed by a much smaller spike, e.g., voltage spikes 205, 210, 215, 220.

Figure 3:
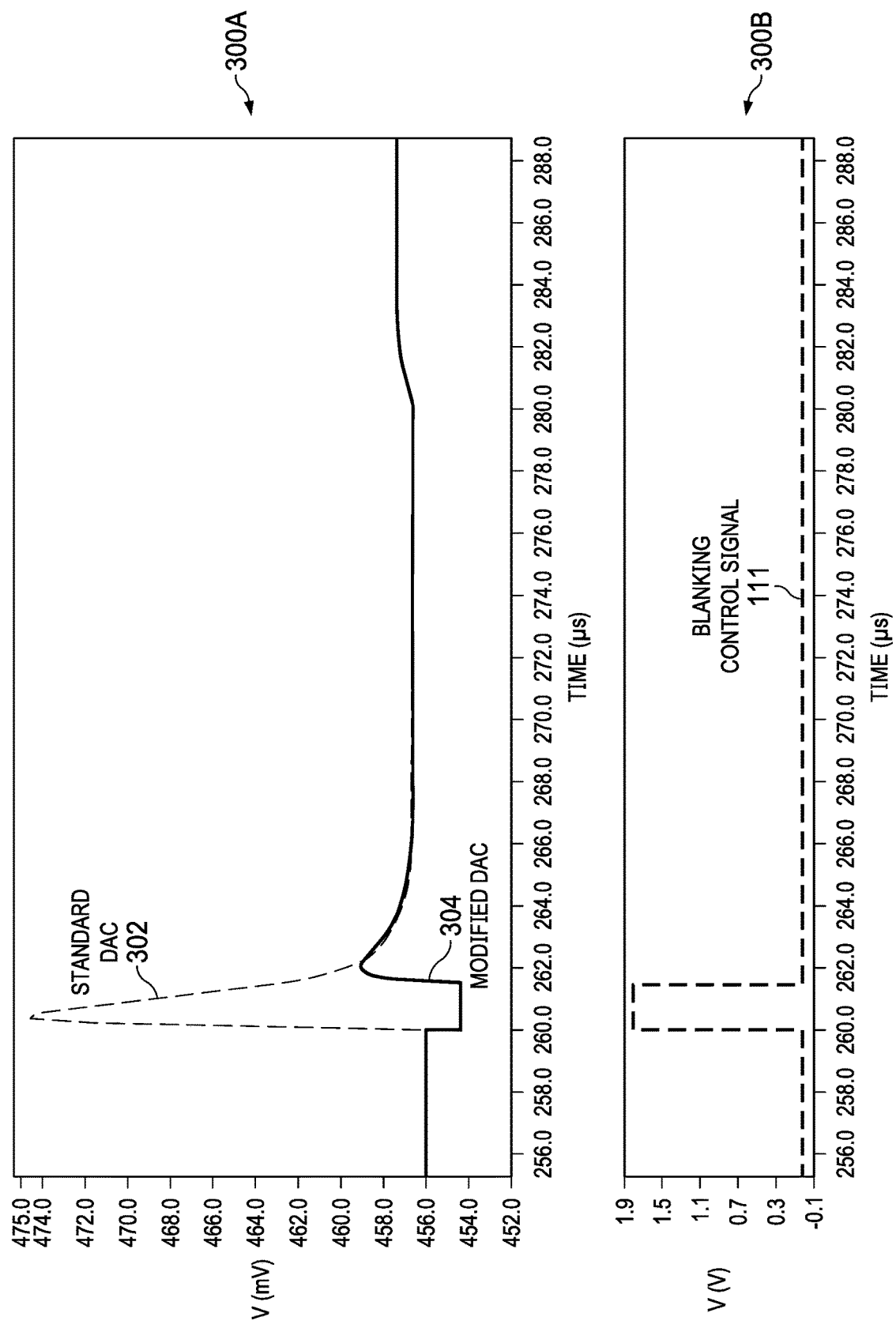
FIG. 3 depicts a highly magnified comparison of the output analog signal without the glitch-reducing circuit and with the glitch-reducing circuit according to an embodiment of the disclosure.

FIG. 3 depicts two graphs 300A, 300B. Graph 300A enlarges and overlays the circled portions of the analog output signal VREF_DAC from FIG. 7 and the blanked analog output signal VREF_DAC_blanked from FIG. 2, while graph 300B depicts the blanking control signal 111. Signal 302 depicts the analog output signal VREF_DAC from the standard DAC and demonstrates voltage spike 705 provided by the prior circuit, while signal 304 is the voltage spike 205 from the blanked analog output signal VREF_DAC_blanked. When blanking control signal 111 goes high, the blanked analog output signal VREF_DAC_blanked drops slightly because no voltage is passing through the transmission gate 104. Once blanking control signal 111 goes low again, transmission gate 104 once again transmits the signal, so that blanked analog output signal VREF_DAC_blanked rises to the same value as analog output signal VREF_DAC. In this manner, the voltage spikes can be removed from the analog signal that is provided for use.

Figure 4:
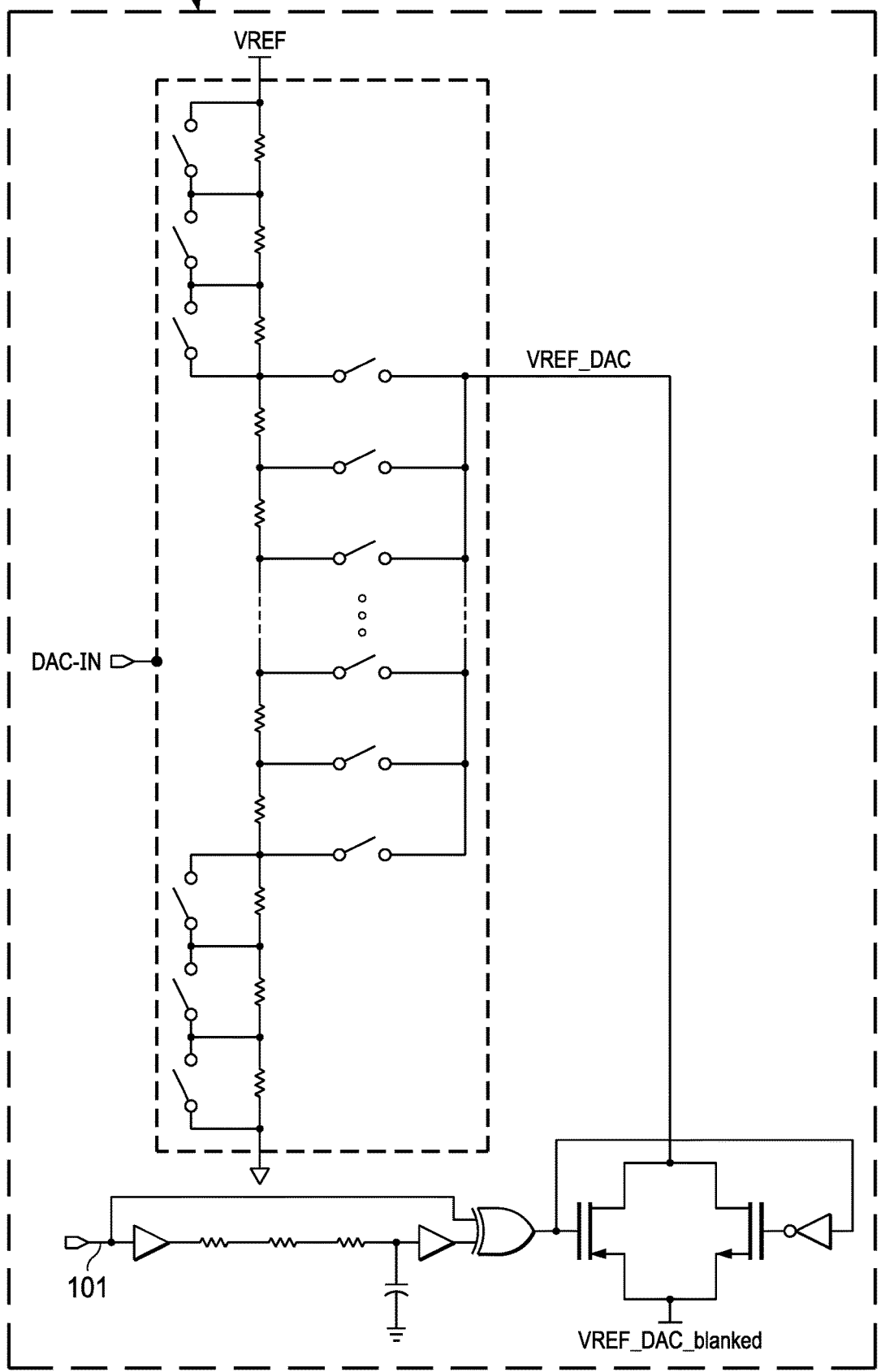
FIG. 4 depicts an electronic device containing an implementation of a segmented DAC using a blanking circuit according to an embodiment of the disclosure.

FIG. 4 depicts an electronic device 400 that includes both a segmented resistor ladder DAC and a blanking circuit as disclosed herein. Electronic device 400 can be a circuit, a stand-alone integrated circuit (IC) chip, part of a larger IC chip or any device that includes a segmented resistor ladder DAC and a blanking circuit working together as shown.

Figure 5:
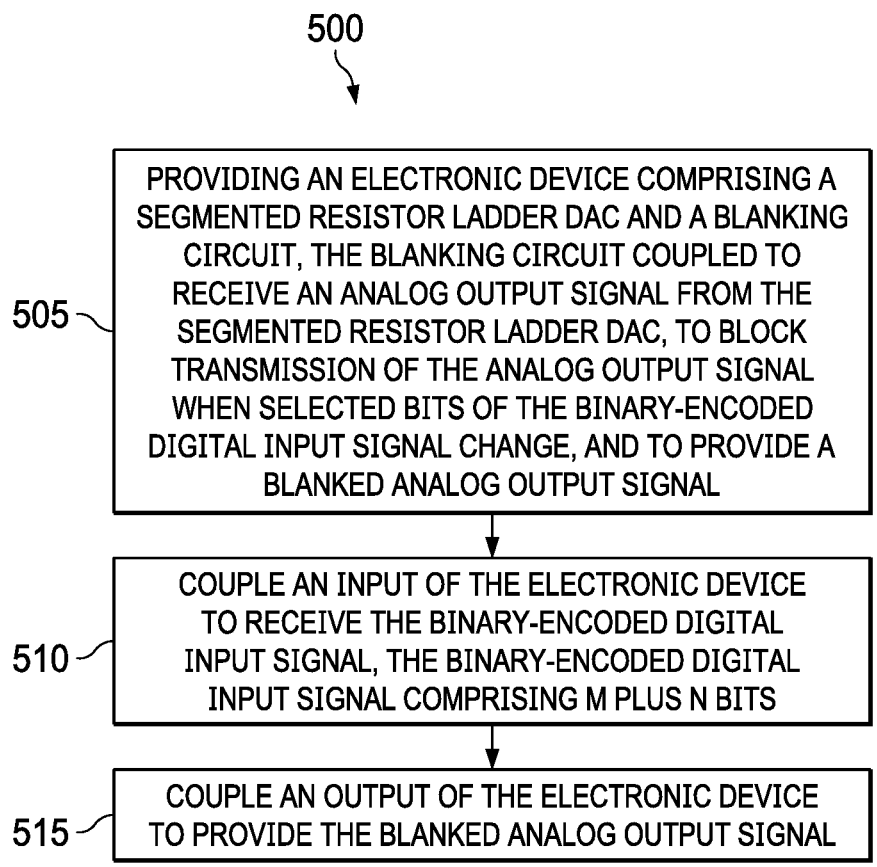
FIG. 5 depicts a flowchart for a method of operating a segmented DAC according to an embodiment of the disclosure.

FIG. 5 depicts a flowchart of a method 500 of operating a segmented DAC according to an embodiment of the disclosure. Method 500 begins with providing 505 an electronic device that includes a segmented resistor ladder DAC and a blanking circuit, the blanking circuit being coupled to receive an analog output signal from the segmented resistor ladder DAC, to block transmission of the analog output signal when a selected portion of a binary-encoded digital input signal changes, and to provide a blanked analog output signal. In one embodiment, the segmented resistor ladder DAC includes a plurality or group of thermometer-DAC resistors coupled to be controlled by M most significant bits of the binary-encoded digital input signal and a first plurality or group of N binary-DAC resistors and a second plurality or group of N binary-DAC resistors are coupled to be controlled by N least significant bits of the binary-encoded digital input signal.

The method continues with coupling 510 an input of the electronic device to receive the binary-encoded digital input signal, which includes M plus N bits, and with coupling 515 an output of the electronic device to provide the blanked analog output signal.

Applicants have disclosed a segmented resistor ladder DAC and a method of using the same. The disclosed segmented resistor ladder DAC includes a blanking circuit that is coupled to receive a selected portion of the binary-encoded digital input signal and depending on the selected portion, can block either all transition points or only those transitions between different segments of the DAC.

Although various embodiments have been shown and described in detail, the claims are not limited to any particular embodiment or example. None of the above Detailed Description should be read as implying that any particular component, element, step, act, or function is essential such that it must be included in the scope of the claims. Reference to an element in the singular is not intended to mean "one and only one" unless explicitly so stated, but rather "one or more." All structural and functional equivalents to the elements of the above-described embodiments that are known to those of ordinary skill in the art are expressly incorporated herein by reference and are intended to be encompassed by the present claims. Accordingly, those skilled in the art will recognize that the exemplary embodiments described herein can be practiced with various modifications and alterations within the spirit and scope of the claims appended below.

What is claimed is:
1. An electronic device comprising:
a digital-to-analog converter (DAC) having a reference voltage input, having binary-encoded digital inputs, the binary-encoded digital inputs including most significant bit inputs and a least significant bit input, and having an analog output;

a transmission gate having a control input, having an input coupled to the analog output, and having a blanked analog output; and a blank pulse generator having a blanking input coupled to most significant bit input and having a control output coupled to the control input, the blank pulse generator including:

an exclusive OR (XOR) gate having a first input coupled to the blanking input, having a second input, and having an output coupled to the control output;

a first buffer having an input coupled to the blanking input and having an output;

a second buffer having an input and having an output coupled to the second input of the XOR gate;

blanking resistors coupled in series between the output of the first buffer and the input of the second buffer; and a capacitor having a first terminal coupled to the input of the second buffer and a second terminal coupled to a local ground.

2. The electronic device as recited in claim 1 in which the DAC includes:

a group of 2M−1 thermometer-DAC resistors coupled in series between the reference voltage input and a local ground;

a group of 2M thermometer-DAC switches, each thermometer-DAC switch having a first terminal coupled between a respective thermometer-DAC resistor and the reference voltage input and a second terminal coupled to the analog output; and a thermometer encoder coupled to the most significant bits (MSBs) of the binary-encoded digital inputs and and having control outputs coupled to the group of 2M thermometer-DAC switches.

3. The electronic device as recited in claim 2 in which the most significant bit inputs exclude the least significant bit input of the binary-encoded digital inputs.

4. The electronic device as recited in claim 2 in which the DAC includes:

N least significant bit inputs;

a first group of N binary-DAC resistors coupled in series between the reference voltage input and the group of 2M−1 thermometer-DAC resistors;

a second group of N binary-DAC resistors coupled in series between the group of 2M−1 thermometer-DAC resistors and the local ground;

a first group of N binary-DAC switches, each of the first group of binary-DAC switches being coupled in parallel with a respective binary-DAC resistor of the first group of binary-DAC resistors to provide a bypass of the respective binary-DAC resistor and each binary-DAC switch of the first group of binary-DAC switches being controlled by a respective one of N least significant bits of the binary-encoded digital inputs, in which the binary-encoded digital input signal has M+N bits; and a second group of binary-DAC switches, each of the second group of binary-DAC switches being coupled in parallel with a respective binary-DAC resistor of the second group of binary-DAC resistors to provide a bypass of the respective binary-DAC resistor and each binary-DAC switch of the second plurality group of binary-DAC switches being controlled by an inverse of a respective one of the N least significant bit inputs.

5. The electronic device as recited in claim 4 in which the bit inputs include the M MSBs.

6. The electronic device as recited in claim 4 in which the bit inputs include the N LSBs.

7. A process of operating a segmented digital-to-analog converter (DAC), the process comprising:

receiving a binary encoded digital input signal including receiving M most significant bit signals (MSBs) in thermometer encoder circuitry and N least significant bit signals (LSBs) in a segmented resistor ladder DAC;

receiving a bit signal other than a LSB signal in a blanking circuit;

producing a blanking signal from the blanking circuit in response to the receiving a bit signal other than a LSB signal;

blanking a transmission of the analog output signal to a circuit output in response to the blanking signal; and providing an analog signal from the segmented resistor ladder DCA in response to the binary-encoded digital input signal.

8. The process as recited in claim 7 including transmitting the analog signal to the circuit output when the least significant bit signal changes state.

9. The process as recited in claim 7 including transmitting the analog signal to the circuit output whenever the M MSB signals maintain their state.

10. The process of claim 7 in which the producing a blanking signal from the blanking circuit in response to the receiving a bit signal other than a LSB signal includes:

producing the blanking signal from an output of an exclusive OR (XOR) gate having a first input receiving the blanking input, having a second input;

receiving the blanking signal in a first buffer and producing a first buffer output signal;

passing the first buffer output signal through series coupled resistors coupled to the output of the first buffer;

receiving the first buffer output signal in an input of a second buffer from the series coupled resistors and producing a second buffer output signal to the second input of the XOR gate; and coupling a first terminal of a capacitor to the input of the second buffer and coupling a second terminal of the capacitor to a local ground.

11. A digital to analog converter circuit comprising:

(a) a reference voltage input and binary-encoded digital inputs including least significant bit inputs and most significant bit inputs;

(b) a thermometer encoder having inputs coupled to the most significant bit inputs and having decoded thermometer outputs;

(c) a segmented resistor ladder coupled between the reference voltage input and a local ground and having an analog output, the segmented resistor ladder including:

a binary-encoded segment having inputs coupled to the least significant bit inputs; and a thermometer-encoded segment having inputs coupled to the decoded thermometer outputs;

(d) blank period circuitry having a blanking signal input coupled to a bit input other than the least significant bit inputs, and having a control output; and (e) transmission circuitry having an analog input coupled to the analog output, having a control input coupled to the control output, and having an analog transmission output.

12. The digital to analog converter circuit of claim 11 in which the blank period circuitry includes:

a gate having a first input coupled to the blanking signal input, a second input and the control output;

blanking resistor circuitry coupled in series between the blanking signal input and the second input of the gate; and a capacitor coupled between the blanking resistor circuitry and the local ground.

13. The digital to analog converter circuit of claim 12 in which the blanking resistor circuitry includes blanking resistors connected in series and including a bypass around a blanking resistor.

14. The digital to analog converter circuit of claim 11 in which the transmission circuitry includes:

first and second transistors having first terminals coupled together and coupled to the analog input, having second terminals coupled together and coupled to the analog transmission output; and gate terminals coupled to the control input.

15. The digital to analog converter circuit of claim 14 in which the first transistor is a P-type field effect transistor and the second transistor is an N-type field effect transistor.

* * * * *